(12) United States Patent
Burger et al.

(10) Patent No.: US 8,178,999 B2
(45) Date of Patent: May 15, 2012

(54) CONTROLLABLE CHANGE-OVER APPARATUS FOR A SOLAR MODULE

(75) Inventors: Bruno Burger, Freiburg (DE); Heribert Schmidt, Freiburg (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 12/682,550

(22) PCT Filed: Sep. 5, 2008

(86) PCT No.: PCT/EP2008/007285
§ 371 (c)(1),
(2), (4) Date: Aug. 12, 2010

(87) PCT Pub. No.: WO2009/049717
PCT Pub. Date: Apr. 23, 2009

(65) Prior Publication Data
US 2010/0295381 A1    Nov. 25, 2010

(30) Foreign Application Priority Data

Oct. 12, 2007 (DE) .................. 10 2007 048 974
Jan. 16, 2008 (DE) .................. 10 2008 004 675

(51) Int. Cl.
 H01H 47/00 (2006.01)
 H01H 35/00 (2006.01)
 H01H 83/18 (2006.01)
 H02H 3/02 (2006.01)
 H02H 3/42 (2006.01)

(52) U.S. Cl. ........................................ 307/126
(58) Field of Classification Search .............. 307/116, 307/126, 87
See application file for complete search history.

(56) References Cited

U.S. PATENT DOCUMENTS
2005/0249234 A1* 11/2005 Kodama et al. ............... 370/445
2009/0284232 A1* 11/2009 Zhang et al. .................. 322/89

FOREIGN PATENT DOCUMENTS
DE    10136147 B4    2/2003
(Continued)

OTHER PUBLICATIONS
English Translation of International Preliminary Report on Patentability in related PCT application No. PCT/EP2008/007285, said report mailed on Aug. 5, 2010, 7 pages.

*Primary Examiner* — Jared Fureman
*Assistant Examiner* — Carlos Amaya
(74) *Attorney, Agent, or Firm* — Michael A. Glenn; Glenn Patent Group (57) ABSTRACT

Controllable change-over apparatus for a solar module comprises an output terminal, a DC/DC converter, a controllable switching device and a control. The controllable switching device is implemented with a first switch position and a second switch position, wherein, in the first switch position, a power output of the solar module is connected to the output terminal via the DC/DC converter, and, in the second switch position, the power output of the solar module is connected to the output terminal by bypassing the DC/DC converter. The control switches the controllable switching device by using a performance characteristic for switching the same to the first or second switch position. In particular, the control is implemented to connect the solar module directly to its output terminal in the case of high power dissipation of the same, i.e. at strong solar radiation, and to connect the solar module to the output terminal via the DC/DC converter in the case of weak power dissipation of the same, i.e. during shading, which significantly increases the efficiency compared to a fixed connection of the solar module.

12 Claims, 8 Drawing Sheets

FOREIGN PATENT DOCUMENTS

| | | |
|---|---|---|
| DE | 102006010694 | 9/2007 |
| DE | 102006023563 A1 | 11/2007 |
| JP | 2005/235082 | 9/2005 |
| WO | WO 03/098703 | 11/2003 |
| WO | WO 2006/079503 | 8/2006 |
| WO | WO-2007/010326 | 1/2007 |

* cited by examiner

CONTROLLABLE CHANGE-OVER APPARATUS FOR A SOLAR MODULE

CROSS-REFERENCE TO RELATED APPLICATION

This application is a U.S. National Phase entry of PCT/EP2008/007285 filed Sep. 5, 2008, and claims priority from German Patent Application No. 102007048974.0 filed Oct. 12, 2007, and German Patent Application No. 102008004675.2 filed Jan. 16, 2008, all of which are incorporated herein by references hereto.

BACKGROUND OF THE INVENTION

The present invention relates to a controllable change-over apparatus for a solar module and a method for controlling the same.

A solar module converts electromagnetical radiation, such as sunlight, into electric energy and comprises, for example, several solar cells.

Solar modules are connected individually or in groups, for example, in photovoltaic plants, small power-supply independent users, or for power supply of spacecrafts.

The electric power ratings of a solar module characterizing a solar module are, for example, open-circuit voltage and short-circuit current. The same can depend on the properties of the individual solar cells and the connection of the solar cells within the module.

When several modules are operated in series, a freewheeling diode or a bypass diode, respectively, can be connected anti-parallel to every module or partial string, respectively. The freewheeling diode can be connected to the output terminals of every module such that the same is reverse-biased in the normal operating state when the module provides current.

Normally, solar modules are provided with a connection box housing the bypass diodes connected anti-parallel to the respective partial strings in the module and the output terminals for the solar module.

If a partial string of the module is shaded, the bypass diode of the same will conduct the differential current between the current of the shaded module string and the solar generator string. Due to the fact that the bypass diode is conductive, the voltage of the shaded module string becomes almost zero (approximately −1 Volt), such that the shaded module string does no longer produce any power.

For avoiding this, DC/DC converters can be used, adapting current and voltage such that the shaded module string still dissipates power. It is, however, a disadvantage that the DC/DC converter also operates in the non-shaded case and, produces electrical losses and reduces the overall efficiency of the solar generator.

Figure 7A:
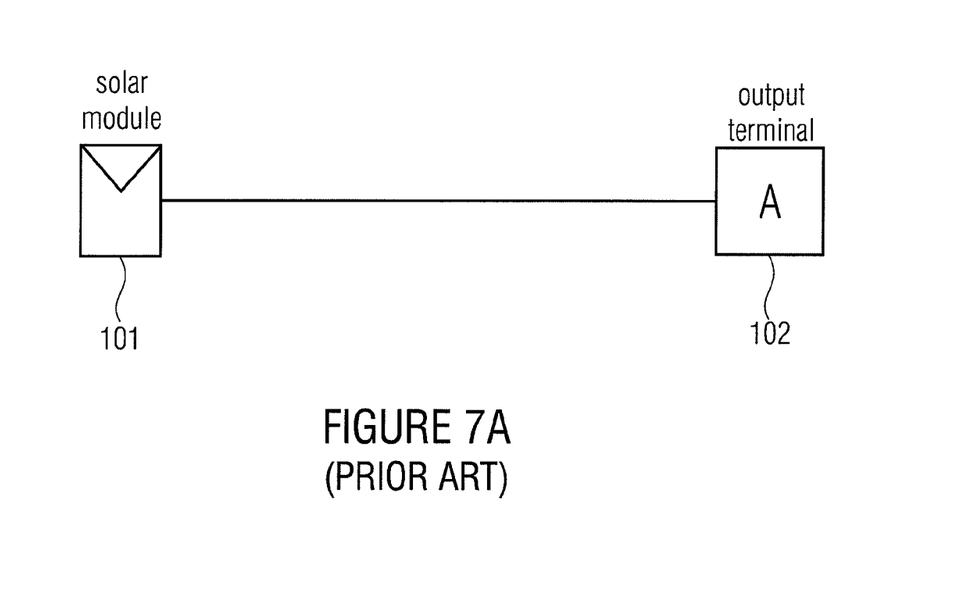
FIGS. 7A and 7B are block diagrams for conventional terminal configurations for solar modules.
Figure 7B:
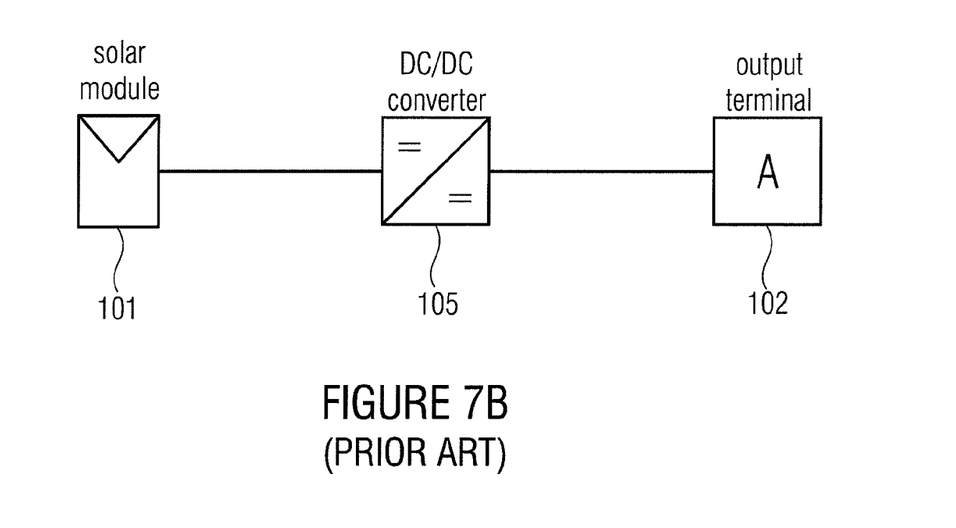

FIG. 7A shows the case of a solar module 101 directly coupled to the module terminal 102, while FIG. 7B shows the case of a solar module 101 connected to the module terminal 102 via a DC/DC converter 105. In the case of FIG. 7Aa, no power losses occur due to a DC/DC converter 105, but shadings of the solar module 101 lead to the above-described problems. The other way round, in the case of FIG. 7B, shading of the solar module 101 does not cause an interruption of the power dissipation, but the overall efficiency of the solar generator is affected, even with full illumination of the solar module 101.

SUMMARY

According to an embodiment, a controllable change-over apparatus for a solar module may have: an output terminal; a DC/DC converter; a controllable switching device with a first switch position and a second switch position; and a control for controlling the controllable switching device for switching the controllable switching device to the first switch position or the second switch position by using a performance characteristic present at the power output of the solar module or a performance characteristic present at the output terminal, wherein, in the first switch position, a power output of the solar module is only connected to the output terminal via a first path comprising the DC/DC converter, and wherein, in the second switch position, the power output of the solar module is only connected to the output terminal via a second path bypassing the DC/DC converter.

According to another embodiment, a method for controlling a controllable change-over apparatus for a solar module, the controllable change-over apparatus comprising: an output terminal, a DC/DC converter, and a controllable switching device with a first switch position and a second switch position, may have the step of: controlling the controllable switching device for switching the controllable switching device to the first switch position or to the second switch position by using the performance characteristic present at the power output of the solar module or the performance characteristic present at the output terminal, wherein, in the first switch position, a power output of the solar module is only connected to the output terminal via a first path comprising the DC/DC converter, and wherein, in the second switch position, the power output of the solar module is only connected to the output terminal via a second path bypassing the DC/DC converter.

Another embodiment may have a computer program having a program code for performing the inventive method when the computer program runs on a computer.

It is a basic idea of the present invention that power increase can be obtained when a change-over option is provided, according to which the solar module is connected directly to an output or module terminal, respectively, or connected to the module terminal via a DC/DC converter. Which of the two connection types is to be used for optimal energy usage can be determined by a control setting a controllable switching device to a first position, where the solar module is connected to the module terminal via the DC/DC converter, by using a performance characteristic present at the power output of the solar module or the module terminal, or to the second position, where the solar module is directly connected to the module terminal. In other words, the power characteristic at the power output of the solar modules including information about the currently generated power of the solar module can be used for causing efficient control of the controllable switching device with regard to increasing the efficiency of the solar module.

BRIEF DESCRIPTION OF THE DRAWINGS

Embodiments of the present invention will be detailed subsequently referring to the appended drawings, in which:

FIG. 1 is a block diagram of a controllable change-over apparatus for a solar module according to an embodiment, wherein

DETAILED DESCRIPTION OF THE INVENTION

Figure 1:
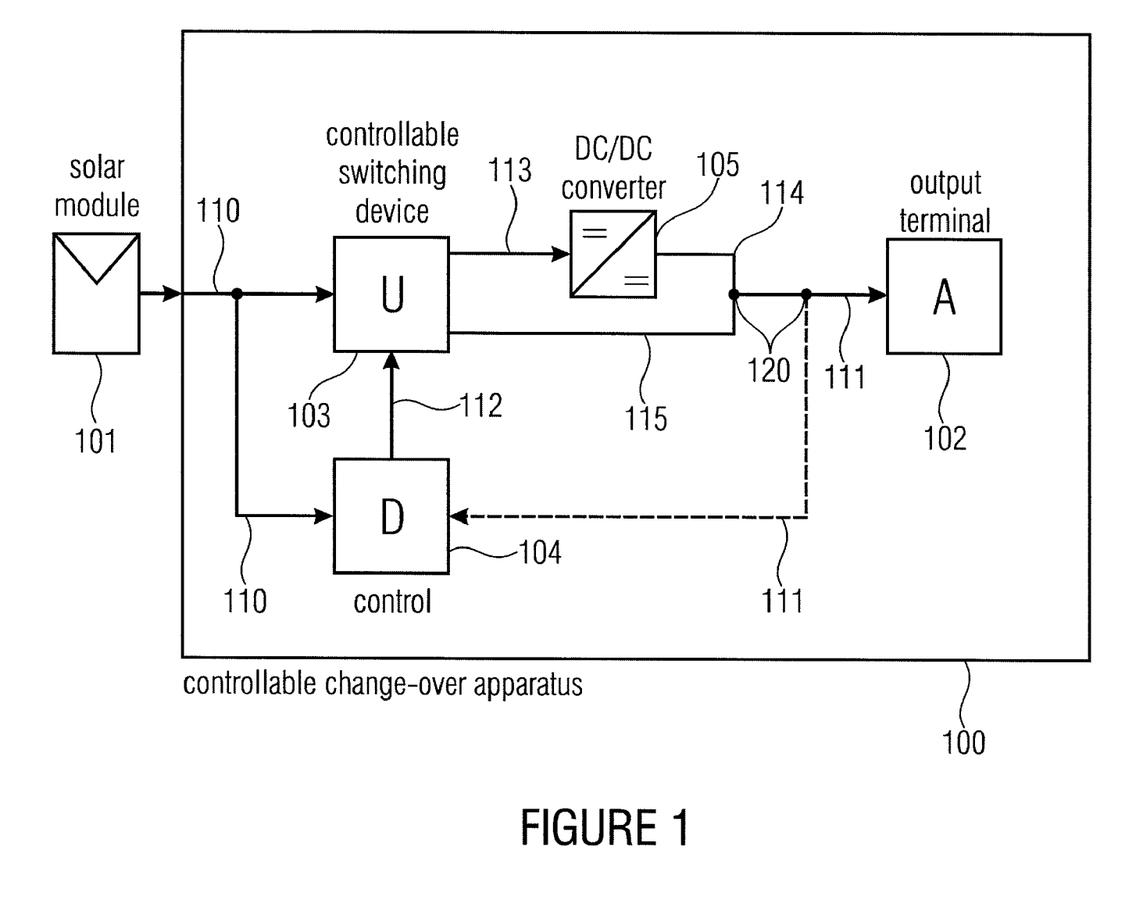

FIG. 1 shows a block diagram of a controllable change-over apparatus 100 for a solar module 101. The same comprises an output terminal 102, a controllable switching device 103, a control 104 as well as a DC/DC converter 105.

The solar module 101 comprises an output 110 connected to an input of the controllable switching device 103 and the control 104. The controllable switching device 103 has two outputs 113 and 115, the output 113 being connected to an output terminal 102 via the DC/DC converter 105, and the output 115 being connected directly to the output terminal 102. The control 104 has an input 110 connected to the output of the solar module and/or a second input 111 connected to the output terminal 102. In other words, in FIG. 1, a node 120 exists to which an output of the DC/DC converter 105 and the second output 115 of the controllable switching device 103 as well as the output terminal 102 and the second input of the control 104 are connected.

The controllable change-over apparatus 100 can increase the efficiency of the solar module 101 by considering that at times of high illumination of the solar module 101 and at times of low illumination, direct coupling of the solar module via the controllable switching device 103 to the output terminal 102 or indirect coupling via the DC/DC converter 105 is advantageous.

In the following, the four cases concerning different combinations of direct and indirect coupling on the one hand and high and low illumination on the other hand, as well as advantages and disadvantages of the four cases will be discussed. The following four variations can be differentiated: "V1. Strong solar radiation without DC/DC converter", "V2. Strong solar radiation with DC/DC converter", "V3. Weak solar radiation with DC/DC converter" and "V4. Weak solar radiation without DC/DC converter".

At strong solar radiation, the power performance characteristic at the power output 110 of the solar module 101 is large and the solar module 101 should be connected directly to the module output 102, i.e. variation V1 is to be used. If, in this case, the solar module 101 is connected to the module output 102 via DC/DC converter 105, i.e. if variation V2 is used, power loss can occur in the DC/DC converter 105, for example, due to its non-ideal construction, which reduces the overall efficiency.

At weak solar radiation or shading, respectively, the performance characteristic at the power output 110 of the solar module 101 is small and the solar module 101 should, according to variation V3, be connected to the module output 102 via a DC/DC converter 105. If, in this case, the solar module 101 is connected directly to the module output 102, i.e. if variation V4 is used, the generated power is reduced, in the extreme case, it can happen that the solar module 101 does not provide any current and the voltage at the terminals reverses polarity, such that the freewheeling diode (not shown) within the solar module 101 becomes conductive and the solar module 101 does not produce any more power. In any case, the efficiency of the solar module 101 is reduced when the same is operated without DC/DC converter 105.

As will be explained in more detail below, the two negative variations "V2. Strong solar radiation with DC/DC converter" and "V4. Weak solar radiation without DC/DC converter" are avoided by the controllable change-over apparatus 100 by to the fact that the control 104 selects, in the case of a higher power characteristic at 110 and/or 111 the direct coupling via 115 and vice-versa. Before the mode of operation of the controllable change-over apparatus 100 will be discussed in more detail, the individual components will be briefly explained.

The solar module 101 can have several semiconductor solar cells (not shown), which are connected for energy production. The cells can be connected in series with conductive traces, for example, at the front and rear sides, whereby the voltage of the individual cells is added and the thinner wires can be used for wiring compared to a parallel circuit. As protection from avalanche breakdown in the individual above-stated cases, such as partial shading, the above-mentioned, protection diodes or bypass diodes, respectively, which are not shown, can be inserted in parallel to the cells that can bridge the cells affected by shading.

The solar module 101 can be defined by certain characteristics, such as open-circuit voltage, short-circuit current, operating point voltage with maximum power, operating point current with maximum power, operating point power with maximum power, filling factor, coefficient for power change with cell temperature and module efficiency. For obtaining high efficiency, the solar module 101 should be operated in the operating point with maximum power, which is described by the operating point current with maximum power and operating point voltage with maximum power. The power at the output 110 of the solar module 101 varies, as has already been mentioned, with the degree of illumination of the solar module 101. As a measure for the power or the rate of utilization of the solar module 101, respectively, the control 104 uses a performance characteristic of the output signal 110 of the solar module 101, which can comprise current and/or voltage at the output 110 for controlling the controllable switching device 103. Alternatively or additionally, the control 104 uses a performance characteristic of the signal 111 at the output terminal 102 that can depend on current and/or voltage for controlling the controllable switching device 103.

Further, the control 104 can be implemented for setting the operating point of the solar module in dependence on the performance characteristic at the power output 110 of the solar module 101, wherein a corresponding arrow is not shown in FIG. 1 for clarity reasons. The operating point could, alternatively, also be regulated or controlled by a control (not shown) apart from the controllable change-over apparatus 100, such as within the solar module 101 itself. In this case, the control 104 could use the operating point setting of the operating point control as performance characteristic.

The controllable switching device 103 is a switching device having two switch positions, wherein in a first switch position, a power output 110 of the solar module 101 is connected to the output terminal 102 via the DC/DC converter 105, and wherein in a second switch position, the power output 110 of the solar module 101 is connected to the output terminal 102 by bypassing the DC/DC converter 105. The switch of the controllable switching device 103 is switched via the control 104 providing a control signal 112, switching the switch to the first or second position. The control 104 controls the controllable switching device 103 by using the performance characteristic present at the power output of the solar module 101 and/or a performance characteristic 111 present at the output terminal 102, wherein the controllable switching device 103 is switched to the first or second switch position. A more detailed description of a possible embodiment of the control 104 will be given in FIG. 5 and FIG. 6.

The controllable switch device 103 can comprise a switch realized in analog circuit technology or in digital circuit technology, in analog circuit technology, for example, an operational amplifier connecting the one or the other input through to the output, depending on an applied voltage, or, in digital circuit technology, a transistor circuit whose transistors are implemented as discrete switching elements.

The control 104 can also be implemented in an analog or digital circuit technology. For example, a control 104 can be realized via a comparator that can be implemented in analog circuit technology as an operational amplifier. In this implementation, the comparator comprises a positive and a negative voltage input, two voltage supply inputs and one voltage output. If the voltage at the positive input is higher than the voltage at the negative input, the output voltage approximates the positive supply voltage. With inverse ratios, the output voltage approximates the negative supply voltage. The comparator is frequently realized as specific operational amplifier operated without reverse coupling, i.e. with very high amplification. Integrated circuits exist that are developed specifically for the intended usage as comparator having several comparators on one chip whose amplifier stages are not optimized for linear operation, but for fast change-over and compatibility with logic circuits. Apart from comparators, the control 104 can include further operational amplifiers that are formed as addable summation amplifiers, differential amplifiers, subtraction amplifiers or inverting amplifiers. With the help of these elements, the whole logic of the control 104 can be realized in analog circuit technology. Further, the control can also be implemented in digital circuit technology, i.e. as a microprocessor processing a program code or as FPGA (Field Programmable Gate Array) connecting digital logic elements or as an integrated circuit via semiconductor elements realized in hardware.

The DC/DC converter 105 is an electronic circuit for voltage conversion. For storing energy, an inductance can be used (inductive converter).

The control 104 controls the controllable switching device 103 in dependence on the power 110 provided by the solar module 101, such that the solar module 101 is connected either directly to the output terminal 102 or via the DC/DC converter 105 to the output terminal 102. With sufficiently high illumination of the solar module 101, i.e. with strong irradiation, the solar module 101 generates high power, which the control 104 detects due to the high performance characteristic, such that the same causes the power to be connected to the output terminal 102 via the controllable switch device 103 in a lossless manner.

For evaluating the power 110 provided by the solar module 101, the control 104 necessitates a threshold based on which the same can decide whether the solar module 101 is in the state of strong irradiation or in the state of shading, and depending thereon, the same can supply the provided power directly to the output terminal 102 or can insert the DC/DC converter 105.

Figure 5:
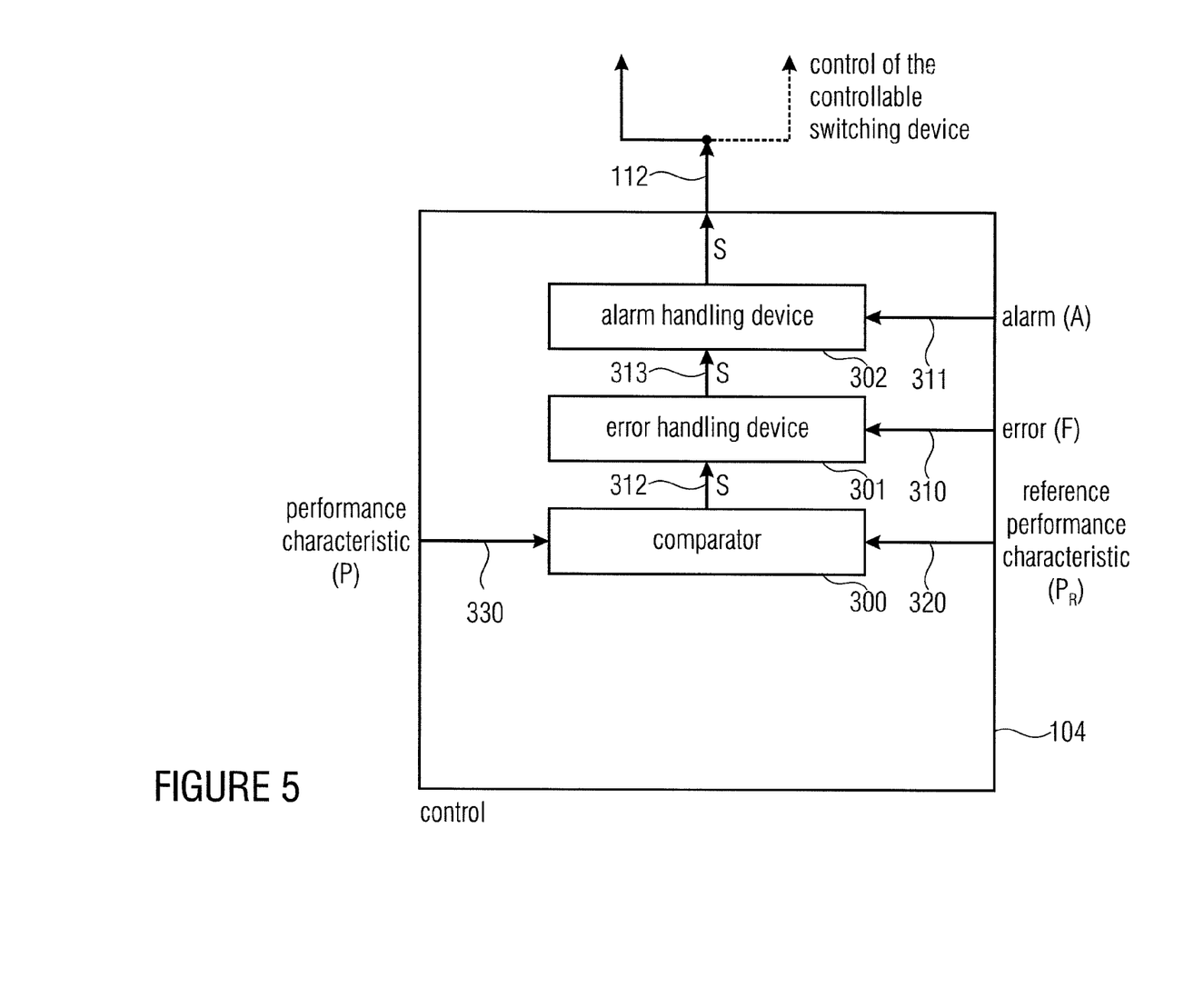
FIG. 5 is a block diagram for a control for a controllable change-over apparatus according to an embodiment.

One embodiment for the control 104 shows the block diagram in FIG. 5. The above-stated threshold is implemented as a reference performance characteristic 320, which is supplied to the control 104 from the outside.

At partial shading of the solar module 101, i.e. at low irradiation, the solar module 101 generates only little power.

In this case, the control 104 detects the reduction in the power 110 provided by the solar module 101 and switches the DC/DC converter 105 between solar module 101 and output terminal 102.

The controllable change-over apparatus 100 increases the efficiency of the solar module 101, since the DC/DC converter 105 is only switched in when necessitated and, hence, no unnecessary power drops at the devices of the same results.

Figure 1A:
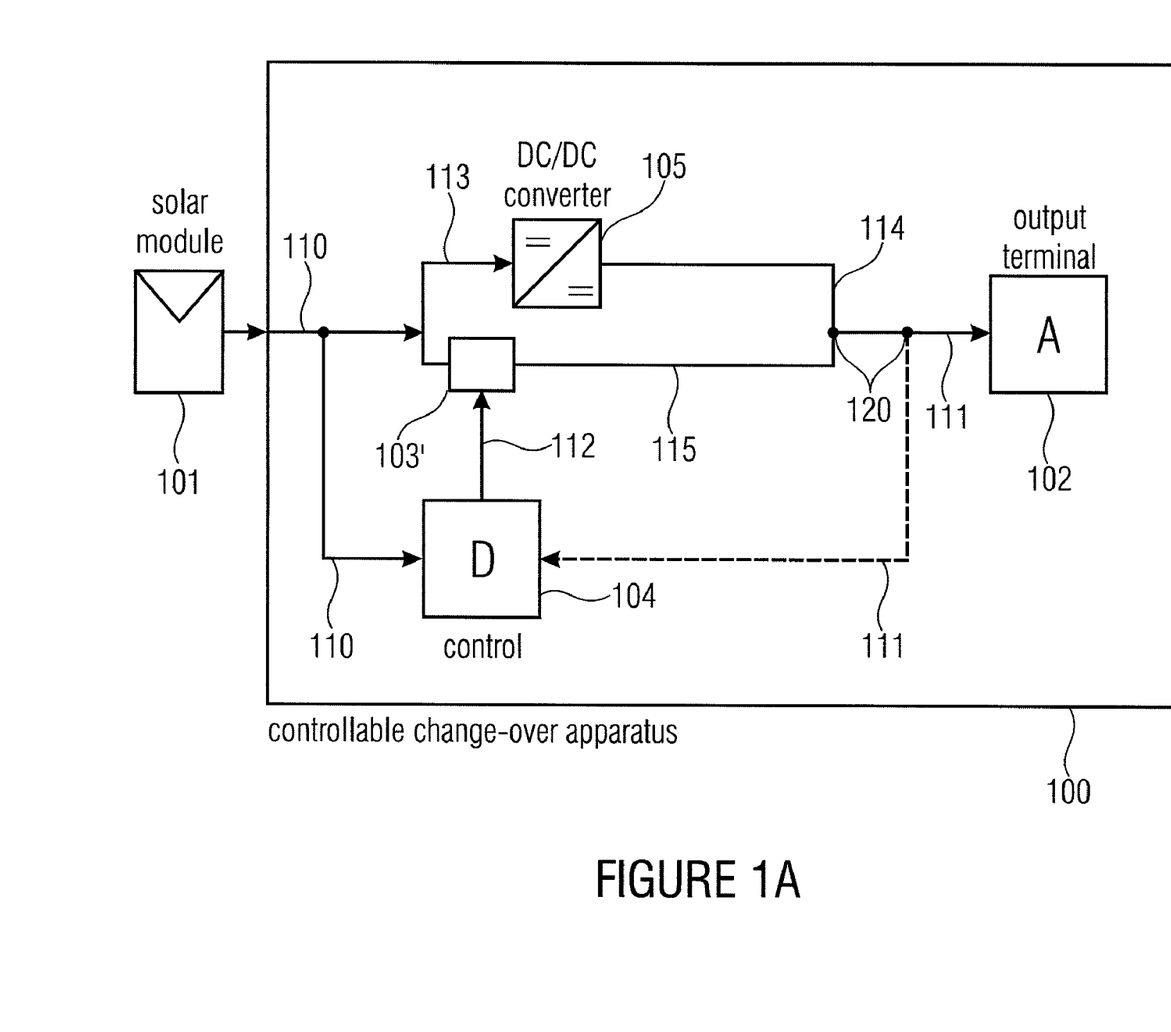
FIG. 1A shows a modified embodiment.

FIG. 1A shows a block diagram of a controllable change-over apparatus 100 for a solar module 101 according to a modified embodiment. Elements that have already been described based on FIG. 1 will not be described again. In this embodiment, the controllable switching device is modified compared to the one shown in FIG. 1. Other than in FIG. 1, in the implementation according to FIG. 1A, the DC/DC converter 105 is connected in parallel to a switching device 103' as bypass or bridging circuit, respectively (e.g. mechanical switch or semiconductor switch) in the 115. The switching device 103' is controlled by control 104, as described above based on FIG. 1, for connecting, in a first switch position (open), the power output 110 of the solar module 101 to the output terminal 102 via the DC/DC converter 105, and for bridging, in the second switch position (closed), the DC/DC converter 105 for connecting the power output 110 of the solar module 101 directly to the output terminal 102.

Figure 2A:
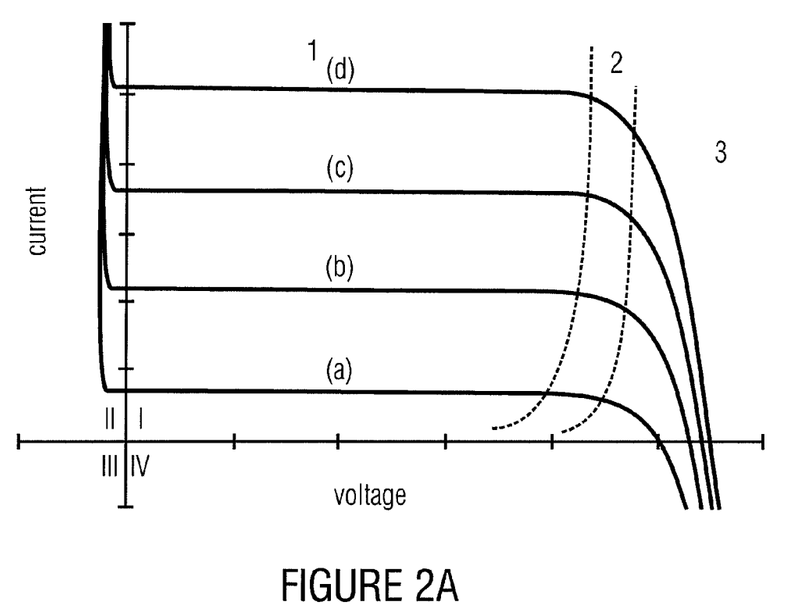
FIGS. 2A and 2B are the voltage/current field of characteristics of a solar module for irradiations (a) to (d) of different strengths or the voltage/power field of characteristics of the solar module for irradiations (a) to (d) of different strengths.
Figure 2B:
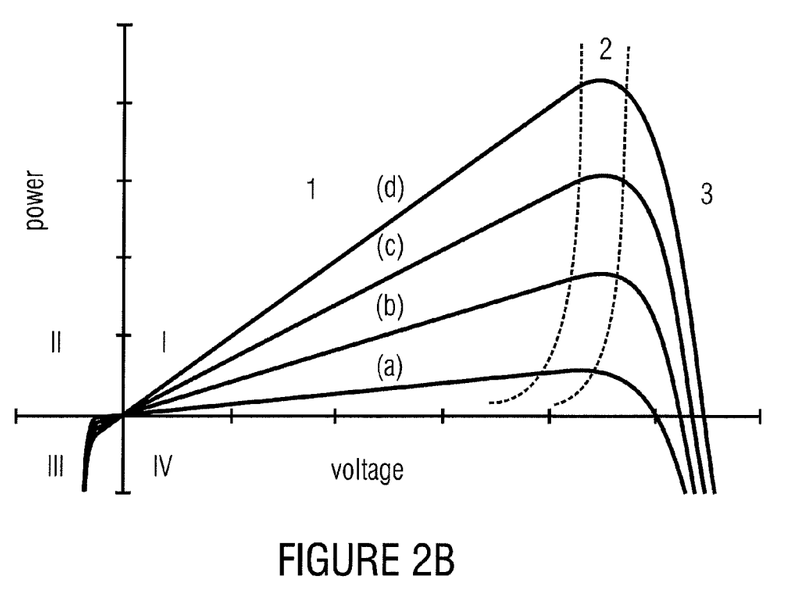

FIGS. 2A and 2B show fields of characteristics for a solar module for different irradiations, wherein FIG. 2A shows the voltage/current field of characteristics for increasing irradiations (a) to (d). In quadrant I, regions 1, 2 and 3 are illustrated, wherein the current curve is substantially horizontal in region 1, drops slightly across region 2 and drops heavily in region 3 and enters quadrant IIII. In quadrant II, the current increases heavily, since the bypass diodes are conductive in this region.

In FIG. 2B, the voltage/power field of characteristics is also shown for irradiations (a) to (d) of different strengths, wherein here also regions 1, 2 and 3 are shown in quadrant I. As can be seen, the power increases substantially linearly in region 1, reaches a maximum in region 2 and drops in region 3.

According to the present invention, the control 104 is implemented to cause switching-in of the DC/DC converter in regions 1 and 3, whereas in region 2 the solar module is connected directly to the output terminal. Region 2 in the diagrams in FIGS. 2A and 2B is the region around the location of maximum power, which results at the optimum operation point setting of the solar module, wherein, according to the embodiment, region 2 extends from a power of approximately 2% below the maximum power via the point of maximum power to a point again approximately 2% below the maximum power.

As long as the power output by the solar module detected by the control is within this region, the output of the solar module is connected directly to the output terminal, otherwise, namely in regions 1 and 3, as mentioned, the DC/DC converter will be switched-in.

Figure 3:
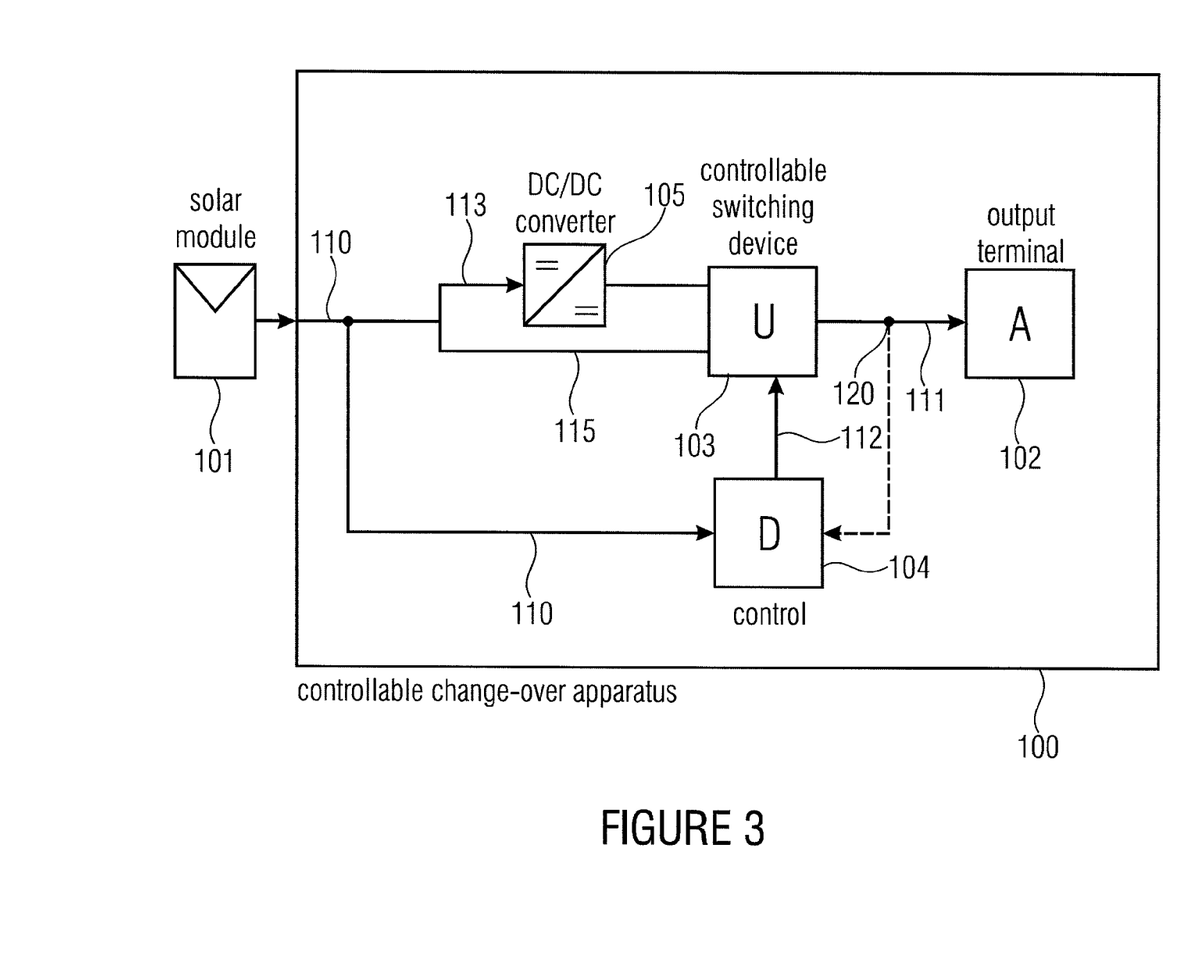
FIG. 3 is a block diagram of a controllable change-over apparatus for a solar module according to a further embodiment.

FIG. 3 shows a further embodiment of the inventive controllable change-over apparatus mainly corresponding the structure of FIG. 1, wherein, in contrary to FIG. 1, the switching device 103 is also connected between the DC/DC converter 105 and the node 120. Thus, the output of the solar module 101 is connected in parallel to an input of the switching device 103 and via the DC/DC converter and a further input of the switching device 103, such that, via the same, the output of the solar module can be connected either directly to the output terminal 102 or via the DC/DC converter to the output terminal 102 in the above described manner, depending on the applied control signal.

Figure 4:
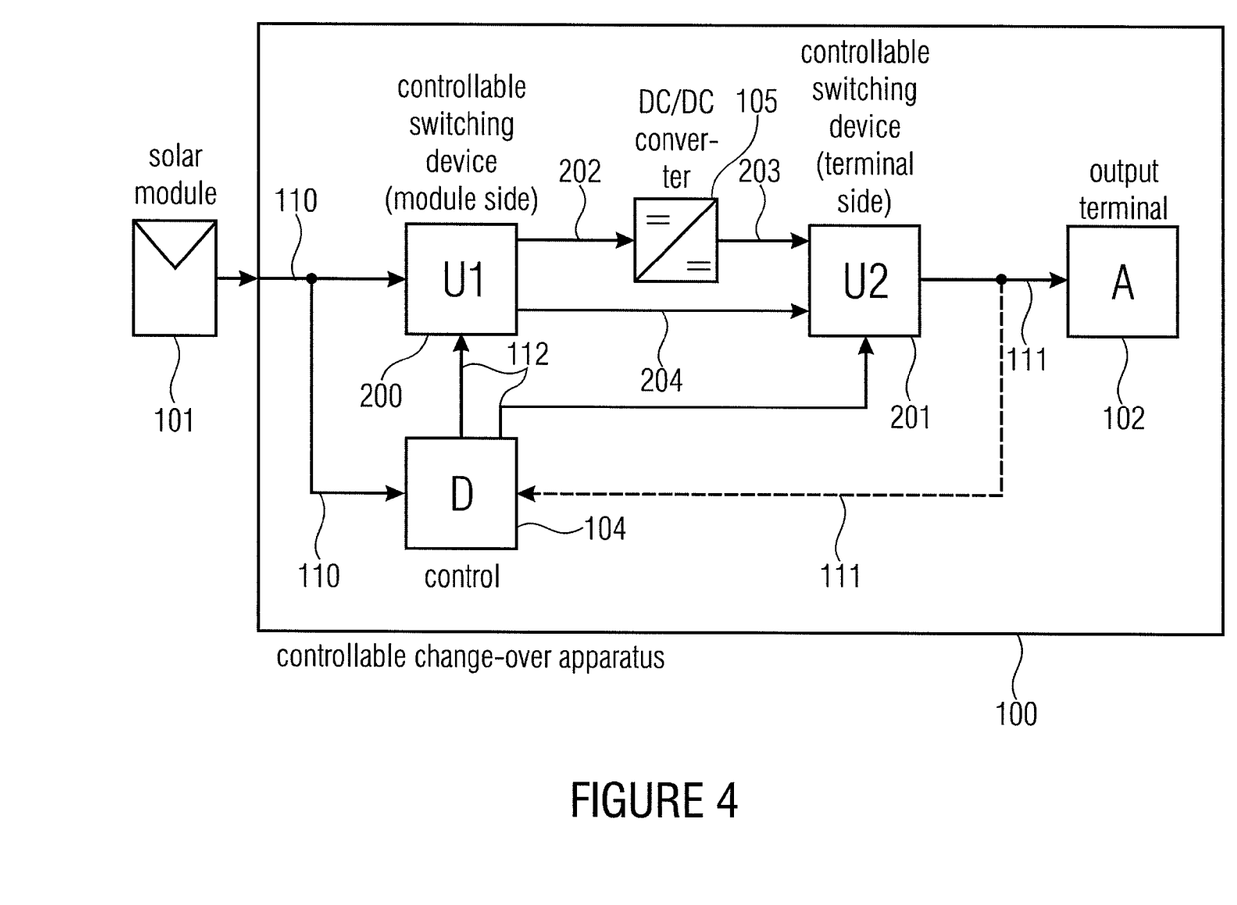
FIG. 4 is a block diagram of a controllable change-over apparatus for a solar module according to again another embodiment.

FIG. 4 shows a block diagram of a controllable change-over apparatus 100 having a module-side part 200 and a terminal-side part 201. In FIG. 1, terminal-side coupling is realized via branch point 120, wherein it is assumed that the output signal 110 of the solar module 101 is either lead via the DC/DC converter 105 or lead directly to the output terminal 102. In FIG. 4, the branch point 110 of FIG. 1 is part of the controllable switching device 103 formed of a module-side part referred to as module-side controllable switching device 200 below, and a terminal-side part, referred to as terminal-side controllable switching device 201 below. Hence, FIG. 1 and FIG. 4 show two implementations of the controllable change-over apparatus. The output 110 of the solar module 101 is connected to the input 110 of the controllable change-over apparatus 100. The controllable change-over apparatus 100 consists of an output terminal 102, a module-side controllable switching device 200, a terminal-side controllable switching device 201, a control 104 as well as a DC/DC converter 105.

The solar module 101 has an output connected to an input of the module-side controllable switching device 200. The module-side controllable switching device 200 has two inputs and two outputs. An input 110 is connected to the output of the solar module 101. The second input 112 is connected to the output of the control 104. An output 202 of the controllable module-side switching device 200 is connected to the input of the DC/DC converter 105, the other output 204 is connected to the second input of the terminal-side controllable switching device 201. The terminal-side controllable switching device 201 has three inputs and one output. One input 203 is connected to the output of the DC/DC converter 105. The second input 204 is connected to the second output of the module-side controllable switching device 200. A third input 112 of the terminal-side controllable switching device 201 is connected to the out of the control 104. The output 111 of the terminal-side controllable switching device is connected to the input of the output terminal 102.

The control 104 has two inputs and two outputs. One input 110 is connected to the output 110 of the solar module 101. The second input 111 is connected to the output terminal 102. One output 112 of the control 104 is connected to the input of the module-side controllable switching device 200, the second output 112 of the control 104 is connected to the terminal-side controllable switching device 201.

The DC/DC converter 105 has an input and an output. The input 202 is connected to the output of the module-side controllable switching device 200 and the output 203 of the DC/DC converter 105 is connected to the input 203 of the terminal-side controllable switching device 201.

Both the controllable switching device on the module side 200 and the DC/DC converter 105 work in the same manner as already described in FIG. 1. Instead of the branch 120 of FIG. 1, in FIG. 4, a terminal-side controllable switching device 201 is connected at this position, which represents an alternative implementation. Module-side controllable switching device 200 as well as terminal-side controllable switching device 201 can be realized both in discrete and in analog circuit technology, as has already been explained in detail in FIG. 1. The control 104 operates in the same manner as illustrated in FIG. 1, wherein the difference is that two control signals 112 are generated instead of one control signal as in FIG. 1. Both control signals 112 are identical to the control signal 112 of FIG. 1, which is why no difference is made in the designation. With the control signal 112, both module-side controllable switching device 200 and terminal-side controllable switching device 201 can be controlled. If the control 104 controls the module-side controllable switching device 200 via the control signal 112 in the manner to switch the same to the first switch position, then, simultaneously, the terminal-side controllable switching device 201 is switched to the first switch position. This applies correspondingly to the second switch position.

In the first switch position, the power output of the solar module 110 is connected to the output terminal 102 via the DC/DC converter 105. In the second switch position, the power output of the solar module 110 is connected to the output terminal 102 by bypassing the DC/DC converter 105. The module-side controllable switching device 200 connects an input 110 to an output 202 or a second output 204, depending on the control signal 112. The terminal-side controllable switching device 201, however, connects an input 203 or a second input 204 to an output 111, depending on the control signal 112 of the control 104.

FIG. 5 shows a possible block diagram for the control 104 for the controllable switching device 100. The control 104 comprises a comparator 300, an error handling device 301 and an alarm handling device 302. The control 104 has four inputs and one output. One input 330 feeds a performance characteristic and is connected to the output 110 of the solar module 101 in an embodiment, the same can, however, also comprise performance characteristics measured in a different manner, for example a derived performance characteristic from the output 110 of the solar module 101 and the input 111 of the output terminal 102. In a further embodiment, the input 330 can also be formed of a first input, for example feeding the output 110, and a second input, for example feeding the input 111.

The second input 320 serves for connecting an external or internal reference performance characteristic for the solar module to the control 104. The third input 310 feeds an error signal F into the error handling device. The fourth input 311 feeds and alarm signal into the alarm handling device. The output 112 of the control 104 is connected to the controllable switching device 103 according to FIG. 1 or simultaneously to the module-side controllable switching device 200 according to FIG. 4 and the terminal-side controllable switching device 201 according to FIG. 4. The dotted arrow in FIG. 1 indicates this, the control 104 provides an output or additionally a second output (dotted), depending on the implementation of the controllable switching device 103 or 200 and 201, respectively.

The comparator 300 has two inputs and one output. One input 330 feeds a performance characteristic and is connected to the output of the solar module 101 in an embodiment, can, however, corresponding to the above embodiment, also be connected to one or several other inputs or outputs. The second input 320 is connected to an input for switching on a reference performance characteristic. The output 312 of the comparator 300 is connected to the input of the error handling device 301.

The error handling device 301 has two inputs and one output. One input 312 is connected to the output of the comparator 300, the second input 310 is connected to an input for switching on an error signal. The output 313 of the error handling device 301 is connected to the input of the alarm handling device 302.

The alarm handling device 302 has two inputs and one output. One input 313 is connected to the output of the error handling device 301, the second input 311 is connected to an input for switching on an alarm signal. The output 112 of the alarm handling device 302 is equal to the output 112 of the control 104 and is connected to the control input 112 of the controllable switching device 103 according to FIG. 1 or to the module-side controllable switching device 200 and the terminal-side controllable switching device 201 according to FIG. 4, respectively. For the second case, the dotted line in FIG. 5 indicates that the control signal 112 is to reach both 200 and 201.

The comparator 300 of the control 104 is implemented for performing a comparison between the performance characteristics at the input 330 and the reference performance characteristics 320. In a specific implementation of the comparator 300, a test is performed whether the performance characteristic at the input 330 is higher or equal to the reference performance characteristics 320. If this condition is fulfilled, the comparator 300 switches its output signal 312 to the state "second switch position", which is to control the controllable change-over apparatus such that the power output 110 of the solar module 101 is connected to the output terminal 102 by bypassing the DC/DC converter 105. If the above stated condition is not fulfilled, i.e., a performance characteristic at the input 330 is smaller than the reference performance characteristic 320, the comparator 300 switches its output signal 312 to the state "first switch position", which means that the controllable switching device 103 is controlled to connect the power output 110 of the solar module 101 to the output terminal 102 via the DC/DC converter 105.

In a further implementation, the comparator 300 is implemented for switching the controllable switching device 103 to the second switch position, when the performance characteristic present at the input 330 has a certain relationship to the reference performance characteristic 320, and for switching the controllable switching device 103 to the second switch position, when the same performance characteristic present at the input 330 does not have this relationship to the reference performance characteristic 320.

The reference performance characteristic 320 can be fed externally via the input for the reference performance characteristic, stored, firmly integrated or derived from the performance characteristic 110 of the power output of the solar module 101. The reference performance characteristic 320 is, for example, a fixed performance characteristic serving as reference for the performance characteristic at the input 330. This means, with the reference performance characteristic 320, it is possible to differentiate whether the solar module 101 operates with full power or is in a shaded state and operates with reduced power. The reference performance characteristic can, for example, be fed from outside, i.e., generated via a generator and then stored in a storage of the controllable change-over apparatus 100. The reference performance characteristics 320 can also have a fixed value, which is firmly integrated in the controllable change-over apparatus 100. In an embodiment, the reference performance characteristic 320 is derived from the performance characteristic 110 at the power output of the solar module 101 and the performance characteristic 111 at the output terminal 102.

An implementation of the deviation of the reference performance characteristic 320 is to form a time maximum value of the performance characteristic 110 at the power output of the solar module 101 or of the performance characteristic 111 at the output terminal 102, and to use the maximum as reference performance characteristic 320. In typical applications, the performance characteristic 110 varies at the power output of the solar module 101 over time. At times of strong solar radiation, the solar module 101 provides maximum power, at times of weaker solar radiation or shading, the solar module 101 provides only reduced power, which is manifested in the performance characteristic 110 at the power output of the solar module 101. If the maximum of these performance characteristics 110 at the power output of the solar module 101 is formed, the maximum power generation value of the solar module is obtained. With the help of this value, a decision can be made whether the output 110 of the solar module 101 can be connected directly to the output terminal 102 or whether a DC/DC converter 105 is necessitated.

The error handling device 301 has the output of the comparator 300 as input 312. With a second input 310, the error handling device 301 is connected to the error output. Via the error output, the control 104 is notified of errors, i.e., if a defect occurs in the controllable switching device 103 or the module-side controllable switching device 200 or terminal-side controllable switching device 201, respectively, the presence of an error is signalized to the error handling device 301 via the error terminal. In the same way, errors of the DC/DC converter 105 are notified to the error input 310 of the control 104. In an embodiment, when an error occurs at the error output 310, the error handling device 301 decides to switch the controllable switching device 103 to the second switch position. This means that the solar module 101 is directly connected to the output terminal 102 by bypassing the DC/DC converter 105. If no error occurs, the output signal of the comparator 312 is switched through directly to the output of the error handling device 313. When an error occurs, the output signal of the error handling device 313 controls the controllable switching device 103 in the manner of switching the same to the second switch position.

The alarm handling device 302 has two inputs and one output. One input 313 is connected to the output of the error handling device 301, the second input 311 is connected to the alarm output. The output of the alarm handling device 112 corresponds to the output of the control 104 and is input of the controllable switching device 103. The alarm handling device 302 is implemented to switch the controllable switching device 103 to a third switch position when an alarm is present. This third switch position is implemented to separate the output of the solar module 101 from the output terminal 102, i.e., when an alarm is present, the solar module 101 is decoupled from its output terminal 102. This is useful in the case of fire. Therefore, the alarm output 311 is coupled to a fire detector and notifies a fire alarm to the alarm handling device 301. Further implementations for alarms would, for example, be a defect of the DC/DC converter 105, which can have the effect that the output terminal 102 is provided with too high a power. The case of an error of the DC/DC converter 105 is already covered with the help of the error output 310, by connecting the solar module terminal 101 directly through to the output terminal 102, but a further possibility can be to separate the solar module terminal 101 from the output terminal 102 and simultaneously notify the operator of an alarm. This can be caused by the alarm handling device 302.

While in the implementation the comparator 300 is connected in front of the error handling device 301 and the same in front of the alarm handling device 302, this order can also be changed. In another implementation it is also possible to connect the comparator output 312 to the input of the alarm handling device 302, and to connect the output of the alarm handling device 302 to the input of the error handling device 301, and to connect its output to the input of the controllable switching device 103. Also, error handling device 301 and alarm handling device 302 can be implemented in front of the comparator 300, which means the order of the three blocks 300, 301 and 302 can be arbitrarily changed.

If the controllable change-over apparatus 100 is in a non-controlled state, the output 112 of the control 104 turns on the controllable switching device 103 in the manner to switch the same to the second switch position. If no output signal 112 of the control 104 is present, then the controllable switching device 103 is implemented such that the same is in the state of the second switch position, i.e., the solar module output 101 is connected through to the output terminal 102 by bypassing the DC/DC converter 105.

While the comparator 300 in FIG. 5 is only illustrated with one input 330 for the performance characteristic, the comparator 300, as has already been discussed above, can also have a further input for a second performance characteristic. For example, the same can have an input 110 and an input 111 and relate those to the reference performance characteristics (PR) at the input 320.

In a further implementation, the comparator 300 can also comprise an additional input for a second reference performance characteristic. Further, the comparator 300 can have several inputs for performance characteristics, and several inputs for reference performance characteristics, wherein the same can then relate the performance characteristics to the reference performance characteristics.

Figure 6:
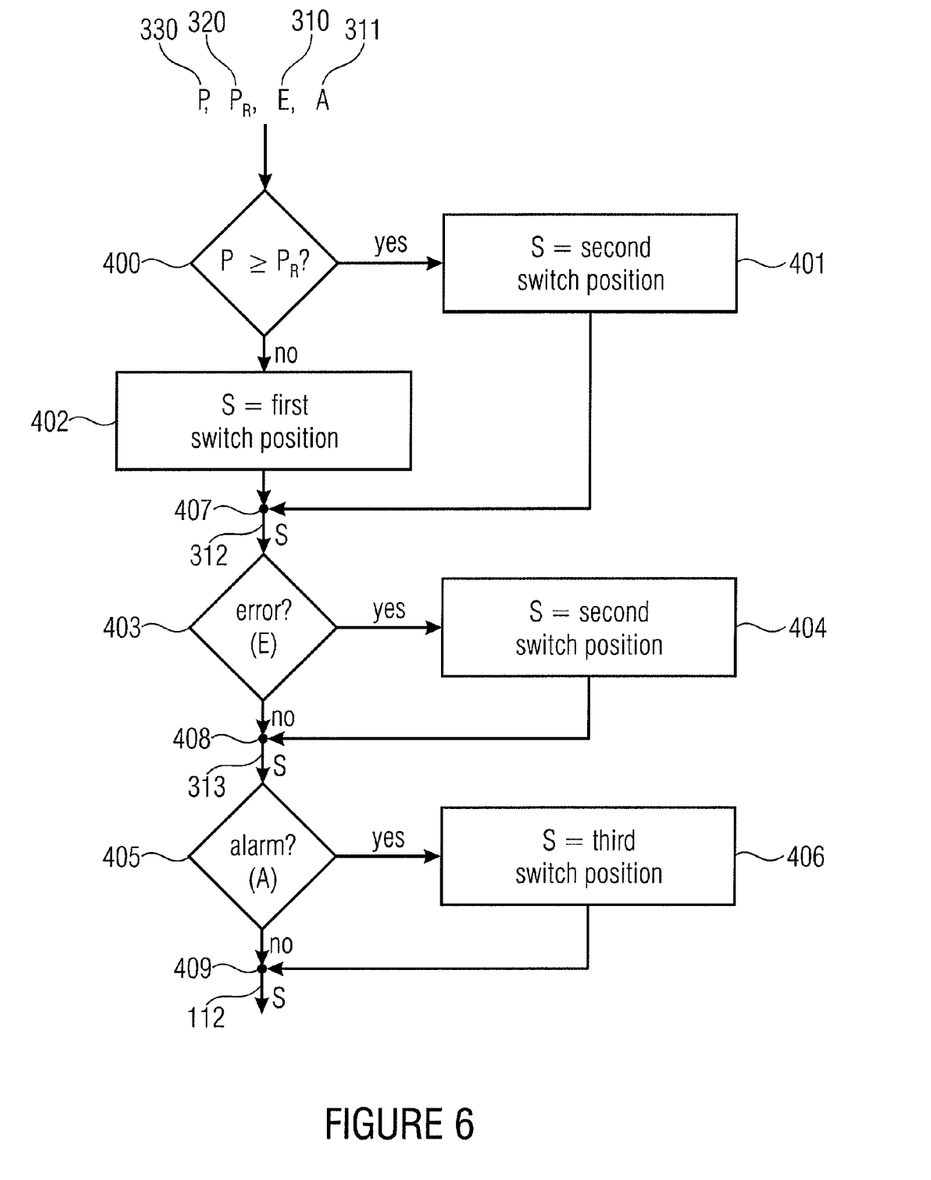
FIG. 6 is a flow diagram for illustrating the mode of operation of the control of FIG. 5.

FIG. 6 shows a flow diagram for illustrating the mode of operation of the control of FIG. 5. The input quantities of the flow diagram are the power performance characteristic (P) at input 330, the reference performance characteristic (PR) at input 111, the error (E) at input 310 and the alarm (A) at input 311. The output of the flow diagram is the output 112 of the control 104 and hence simultaneously the input of controllable switching device 103.

In a first comparison step of a conditional branching element 400, a test is performed whether the performance characteristic (P) at the input 330 is higher or equal to the reference performance characteristic (PR) at the input 320. If this is the case, the controllable switching device 103 is controlled in an instruction 401 such that the same is switched to a second switch position, i.e., the solar module 101 is connected directly through to the output terminal 102 by bypassing the DC/DC converter 105. If the condition of the conditional branching element 400 is not fulfilled, the controllable switching device 103 is controlled such that the same is switched to the first switch position, i.e., the solar module output 101 is connected to the output terminal 102 via the DC/DC converter 105. After the switch control, the two branches of the conditional branching device 400 are combined again in one point 407, and depending on whether the yes-case or the no-case of the condition of the conditional branching element 400 has been passed, a different control signal 312 results, which is now the input signal for the query of the conditional branching element 403.

In this query, it is examined whether an error (E) is applied to input 310. For the yes case, the control signal is controlled in an instruction 404 such that the controllable switching device 103 is switched to the second switch position. For the no case, i.e., no error is present, the applied control signal 312 is not changed. Both branches of the query of the conditional branching element 403 are combined in point 408, such that a control signal 313 results, which is the input signal for the query of the conditional branching element 405.

In the query of the conditional branching element 405, it is examined whether an alarm is applied at the alarm input 311. If this is the case, the controllable switching device 103 is controlled such as to switch the same in an instruction 406 to the third switch position, which means to separate the solar module 101 from the output terminal 102. If the query of the conditional branching element 405 indicates that no alarm has occurred, the input control signal 313 of the alarm handling device 302 is connected to the output in an un-amended manner. Both branches of the conditional branching element 405 are combined in point 409 and determine the output 112 of the control 104 for controlling the controllable switching device 103.

As has already been mentioned in FIG. 5, it is possible to change the order of the queries. In a further implementation, for example, the alarm query 405 can be passed through first, and when an alarm exists, the further queries can be skipped. Then, the error query 403 can be executed and when an alarm exists, the further queries can be skipped. Then, as a last step, the power comparison 400 between performance characteristic at the power output of the solar module and reference performance characteristic could be performed.

FIGS. 7A and 7B show block diagrams for conventional terminal configurations for solar modules 101. Conventionally, the solar module 101 is connected directly to its output terminal 102, as illustrated in FIG. 7A. However, a disadvantage of the direct connection according to FIG. 7A occurs when the solar module 101 is partially shaded.

If a partial string of the solar module 101 is shaded, its freewheeling diode conducts, as has already been discussed, the differential current between the current of the shaded module string 101 and the solar generator string, and the shaded module string 101 will no longer produce sufficient power. For avoiding this, the DC/DC converter 105 can be used as illustrated in FIG. 7B. The DC/DC converter 105 adapts the current and the voltage such that the shaded module string 101 still dissipates power. However, the DC/DC converter 105 does not work in the shaded state and affects the overall efficiency of the solar generated generator by the power dropping at its devices.

A further implementation can also be described as follows: The invention consists of a control 104, which can also be implemented as a detection device, which detects the case of shading of a module string 101, and of a change-over apparatus 103, which establishes, in the un-shaded case, a direct connection between the module string 101 and the output terminals 102 of the solar module, and connects, in the shaded case, the shaded partial string 101 the output terminals 102 of the solar module via a DC/DC converter 105.

Advantageously, this change-over apparatus 100 is implemented such that it establishes the direct connection as a standard and the connection via the DC/DC converter 105 has to be switched on actively.

Further, the change-over apparatus 100 is advantageously implemented such that in the case of an error or a defect of the shading detector 104 or the DC/DC converter 105, the direct connection to the output terminals is established.

A further advantageous implementation of the invention allows the separation of the solar module 101 from the terminals 102 by the change-over apparatus 100. This is particularly useful in the case of fire. Therefore, the detection device D obtains a further detector for detecting a fire.

Depending on the circumstances, the inventive method can be implemented in hardware or in software. The implementation can be made on a digital memory medium, in particular a disc or a CD with electronically readable control signals that can cooperate such with a programmable computer system that the respective method is performed. Generally, hence, the invention consists also in a computer program product with a program code for performing the inventive method stored on a machine readable carrier, when the computer program product runs on a computer. In other words, the invention can be realized as a computer program with a program code for performing the method when the computer program runs on computer.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A controllable change-over apparatus for a solar module, comprising:
   an output terminal;
   a DC/DC converter;
   a controllable switching device with a first switch position and a second switch position; and
   a control for controlling the controllable switching device for switching the controllable switching device to the first switch position or the second switch position by using a performance characteristic present at the power output of the solar module or a performance characteristic present at the output terminal,
   wherein, in the first switch position, a power output of the solar module is only connected to the output terminal via a first path comprising the DC/DC converter, and
   wherein, in the second switch position, the power output of the solar module is only connected to the output terminal via a second path bypassing the DC/DC converter.

2. The controllable change-over apparatus according to claim 1, wherein the control is further implemented to set an operating point of the solar module in dependence on the performance characteristic present at the power output of the solar module.

3. The controllable change-over apparatus according to claim 1, wherein the control comprises:
   an input for a reference performance characteristic,
   a comparator for comparing the performance characteristic present at the power output of the solar module with the reference performance characteristic,
   wherein the comparator is implemented to switch the controllable switching device to the second switch position when the performance characteristic present at the power output of the solar module has a certain relation to the reference performance characteristic, and to switch the controllable switching device to the second switch position when the performance characteristic present at the power output of the solar module does not have this relation to the reference performance characteristic.

4. The controllable change-over apparatus according to claim 1, wherein the controllable switching device is implemented such that the same is in the second switch position in a non-controlled case.

5. The controllable change-over apparatus according to claim 1, wherein the control further comprises:
   an error-handling device for detecting a defect of the controllable switching device or the DC/DC converter, which is implemented to switch the controllable switching device to the second switch position if an error of the controllable switching device or the DC/DC converter is present.

6. The controllable change-over apparatus according to claim 1, wherein the controllable switching device further comprises:
   a third switch position, wherein the power output of the solar module is separated from the output terminal.

7. The controllable change-over apparatus according to claim 6, wherein the control further comprises:
   an alarm-handling device for detecting an alarm of the controllable change-over apparatus, the solar module or the output terminal, which is implemented to switch the controllable switching device to the third switch position if an alarm of the controllable change-over apparatus, the solar module or the output terminal is present.

8. The controllable change-over apparatus according to claim 3, wherein the reference performance characteristic is externally fed via the input for the reference performance characteristic, stored, firmly integrated or derived from the performance characteristic of the power output of the solar module.

9. The controllable change-over apparatus according to claim 1, wherein the controllable switching device and the DC/DC converter are connected in parallel between a power output of the solar module and the output terminal.

10. The controllable change-over apparatus according to claim 9, wherein the controllable switching device comprises a mechanical switch or a semiconductor switch.

11. A method for controlling a controllable change-over apparatus for a solar module, the controllable change-over apparatus comprising: an output terminal, a DC/DC converter, and a controllable switching device with a first switch position and a second switch position,
   the method comprising:
   controlling the controllable switching device for switching the controllable switching device to the first switch position or to the second switch position by using the performance characteristic present at the power output of the solar module or the performance characteristic present at the output terminal,
   wherein, in the first switch position, a power output of the solar module is only connected to the output terminal via a first path comprising the DC/DC converter, and
   wherein, in the second switch position, the power output of the solar module is only connected to the output terminal via a second path bypassing the DC/DC converter.

12. A non-transitory computer readable storage medium storing a computer program comprising a program code for performing the method for controlling a controllable change-over apparatus for a solar module, the controllable change-over apparatus comprising: an output terminal, a DC/DC converter, and a controllable switching device with a first switch position and a second switch position,
   the method comprising:
   controlling the controllable switching device for switching the controllable switching device to the first switch position or to the second switch position by using the performance characteristic present at the power output of the solar module or the performance characteristic present at the output terminal,
   wherein, in the first switch position, a power output of the solar module is only connected to the output terminal via a first path comprising the DC/DC converter, and
   wherein, in the second switch position, the power output of the solar module is only connected to the output terminal via a second path bypassing the DC/DC converter,
   when the computer program runs on a computer.

* * * * *